United States Patent
Klim

Patent Number: 5,761,107
Date of Patent: Jun. 2, 1998

[54] METHOD AND APPARATUS FOR IMPROVING THE SPEED OF A LOGIC CIRCUIT

[75] Inventor: Peter Juergen Klim, Austin, Tex.

[73] Assignee: International Business Machines Corporation, Armonk, N.Y.

[21] Appl. No.: 629,703

[22] Filed: Apr. 9, 1996

[51] Int. Cl.[6] .................................................. G06F 7/50
[52] U.S. Cl. ....................................................... 364/784.03
[58] Field of Search ........................... 364/784.03, 786.03

[56] References Cited

U.S. PATENT DOCUMENTS

| | | | |
|---|---|---|---|
| 4,559,609 | 12/1985 | Robinson, Jr. et al. | 364/784.03 |
| 4,970,677 | 11/1990 | Young | 364/784.03 |
| 4,989,174 | 1/1991 | Gardei | 364/784.03 |
| 4,999,804 | 3/1991 | Nukiyama | 364/784.03 |
| 5,148,387 | 9/1992 | Yano et al. | 364/784.03 |
| 5,406,506 | 4/1995 | Jiasheng et al. | 364/784.03 |

*Primary Examiner*—David H. Malzahn
*Attorney, Agent, or Firm*—Anthony V. S. England

[57] ABSTRACT

The invention is disclosed as embodied in a data processing system circuit for outputting a signal based on an evaluation of input signals coupled to the circuit. The circuit has a number of transistors configured so that the output signal is triggered by a triggering combination of input signals. The circuit also has a discharge transistor coupled to a signal for switching the discharge transistor to a state tending to discharge a node in the circuit. The node must be discharged to a certain level to trigger the output signal, so that discharging the node after it has become charged up above the certain level tends to reduce evaluation time for the circuit.

2 Claims, 3 Drawing Sheets

5,761,107

1

METHOD AND APPARATUS FOR IMPROVING THE SPEED OF A LOGIC CIRCUIT

FIELD OF THE INVENTION

This invention relates generally to high-speed circuits for information processing systems, and more specifically may apply to CMOS digital logic circuits for microprocessor execution units.

CROSS REFERENCE TO RELATED PATENT APPLICATIONS

None.

BACKGROUND OF THE INVENTION AND PRIOR ART

In certain microprocessor circuits it is imperative to reduce the time required for a circuit to evaluate input signals. This is particularly true in microprocessor execution units, wherein there are series of stages, and the signals are evaluated and passed from one stage to the next. One such circuit is a carry circuit, which is a part of a carry save adder ("CSA").

FIG. 1 shows a prior art carry circuit 100. This circuit receives three data input signals, s1, s2 and s3, on input lines s1, s2 and s3 and receives complemented data input signals, s1n, s2n and s3n, on input lines s1n, s2n and s3n. The circuit also receives a reset signal, r, on line r, and a counterpart reset signal, rn, on line rn. The reset signal, r, is asserted as a high level, and concurrently the counterpart signal, rn, is asserted as a low level. The circuit outputs a carry signal, c, on line c, and a complemented carry signal, cn, on line cn.

Generally, the following discussion will describe signals without reference to complements or counterparts of the signals, but it should be understood that the complements or counterparts exist and the circuit responds accordingly. The input signals, s1, s2 and s3, are presented to the circuit 100 during an evaluation period according to a certain timing sequence established externally to the circuit 100. This timing is illustrated in FIG. 2. According to this timing, a standby period begins when the reset signal, r, and the counterpart signal, rn, are deasserted. An evaluation period then begins when one or more of the input signals, s1, s2, and s3, are asserted. The evaluation period ends when the input signals are deasserted. A reset period then begins when r and rn are asserted. During the evaluation period, the data signals s1, s2 and s3 are valid and one or more of them may be asserted for evaluation by the carry circuit 100. In one further aspect, not shown in FIG. 2, the data signals may arrive at circuit 100 in a certain sequence in time.

During the evaluation period the circuit evaluates the inputs, performing a combination of logical "AND/OR" functions such that, for example, the circuit 100 asserts the carry signal, c, if any two of the inputs are asserted. That is, in boolean terms, the carry condition is satisfied and the carry signal, c, is asserted if (s1*s2)+(s1*s3)+(s2*s3).

Although circuit 100 performs a required logical evaluation function, it is problematic because the circuit is not fast enough to achieve required system cycle time when it is cascaded in several stages, as is required for a CSA. Therefore a need exists to further improve the speed of operation of a carry circuit such as the prior art circuit 100.

SUMMARY OF THE INVENTION

An objective of the invention is to improve the speed of circuit operation for evaluating digital logic signals in a microprocessor execution unit.

2

According to the present invention, the foregoing and other objects are attained by a data processing system logic circuit for outputting a signal based on an evaluation of input signals coupled to the circuit. The circuit has a number of transistors configured so that the output signal is triggered by a triggering combination of input signals. The circuit also has a discharge transistor coupled to a signal for switching the discharge transistor to a state tending to discharge a node in the circuit. The node must be discharged to a certain level to trigger the output signal, so that asserting the signal to the discharge transistor after the node has become charged up above the certain level tends to discharge the node and reduce evaluation time for the circuit.

The invention further contemplates that the node tends to charge up for a certain non-trigerring combination of input signals, so that after the non-triggering combination, the node must be discharged to the certain level for a subsequent triggering combination of input signals to trigger the output signal. The input signals are asserted during evaluation intervals and the reset signal is asserted during an interval between evaluation intervals, so that if the non-triggering combination of input signals is asserted during a first evaluation interval, and the triggering combination of input signals is asserted during a second evaluation interval, asserting the signal to the discharge transistor tends to discharge the node before the second evaluation interval and reduces evaluation time during the second evaluation interval.

The invention may also be practiced, in yet another aspect, as a method for evaluating signals input to a circuit. According to the method, a discharge transistor is provided, switchable to a state tending to discharge a certain node in the circuit. The discharge transistor is switched by communicating a signal to the discharge transistor so that the node tends to discharge prior to an evaluation interval, consequently reducing the time required by the circuit to evaluate the input signals.

In further aspects of the method, the node tends to charge up during an evaluation interval if a certain combination of input signals are asserted. For that certain combination of input signals, the evaluation of the input signals does not trigger an output signal. The discharge transistor is coupled to the node and the node tends to discharge through the discharge transistor.

In addition, the method contemplates switching at least one evaluating transistor in the circuit, during a first evaluation interval, by asserting an input signal coupled to the circuit. The node is coupled to the evaluating transistor and tends to charge up during the first evaluation interval. Also, a number of evaluating transistors in the circuit are switched, during a second evaluation interval, by asserting a number of input signals coupled to the circuit, and the node tends to discharge through the transistors in order to switch an output signal of the circuit.

In one embodiment, in order for an evaluation to result in asserting the output signal, more than one of the input signals must be asserted. Further, the circuit may have more than one output signal, a particular output signal being asserted based on the circuit evaluating a group of input signals associated with the particular output signal.

It is an advantage of the present invention that the method and apparatus may be applied in carry circuits for a carry save adder having a number of carry circuits, so that a fast cycle time may be achieved in an execution unit.

Additional objects, advantages, and novel features are set forth in the following description, or will be apparent to those skilled in the art or those practicing the invention.

Other embodiments are within the spirit and scope of the invention. These objects and embodiments may be achieved by the combinations pointed out in the appended claims. The invention is intended to be limited only as defined in the claims.

DESCRIPTION OF THE PREFERRED EMBODIMENT

To clearly point out and elaborate upon novel features of the present invention, the following discussion omits or only briefly describes conventional features of circuits for information processing systems which are apparent to those skilled in the art. It is assumed that those skilled in the art are familiar with high-speed circuit design and in particular with high-speed, CMOS, digital logic circuit design.

Figure 3:
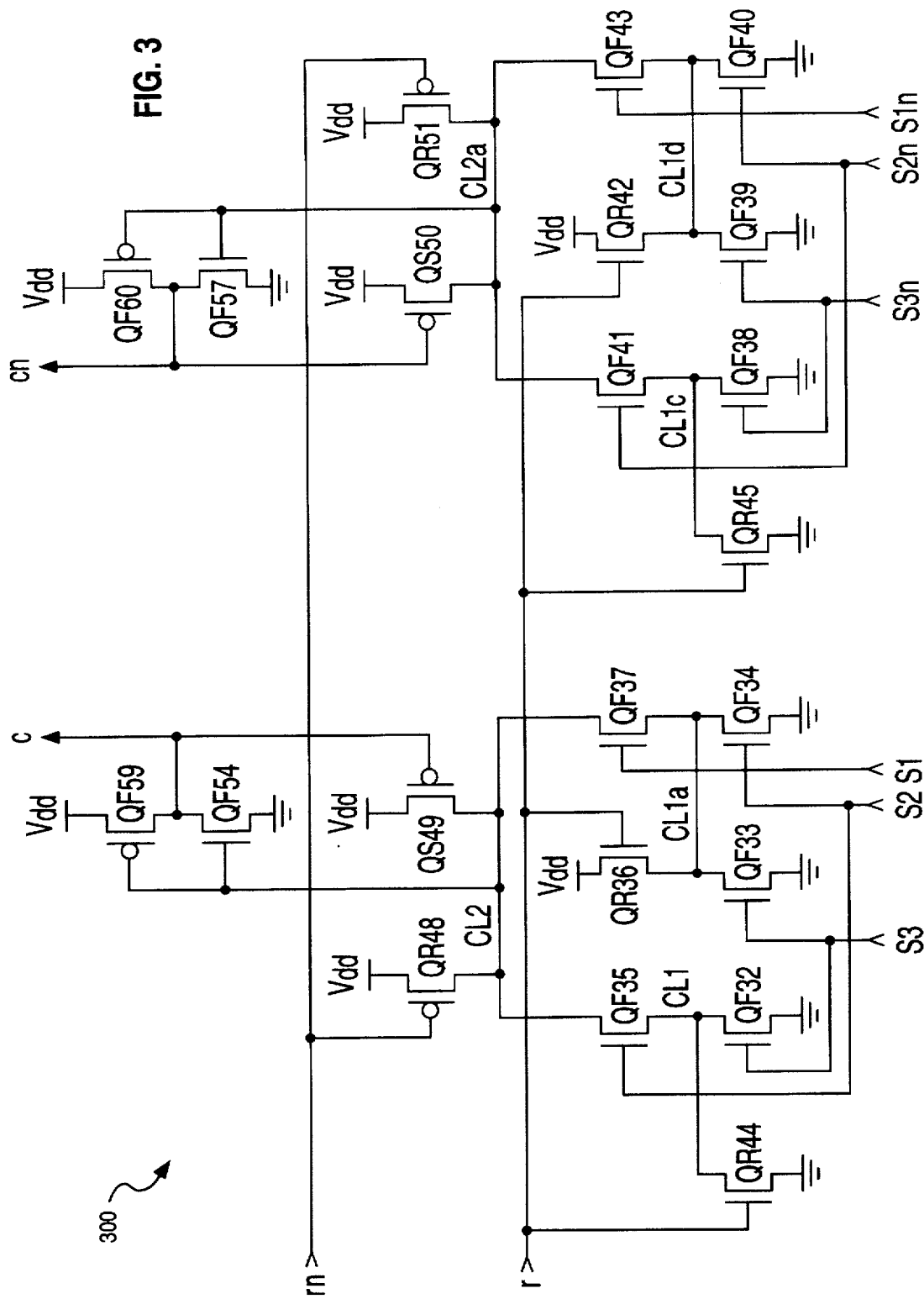
FIG. 3 is a circuit diagram for a carry circuit illustrating an embodiment of the present invention.

FIG. 3 shows a preferred embodiment of the present invention carry circuit 300, which has certain improved features for speeding up evaluation of input signals. This circuit receives three data input signals, s1, s2 and s3, on input lines s1, s2 and s3 and receives complemented data input signals, s1n, s2n and s3n, on input lines s1n, s2n and s3n. The circuit also receives a reset signal, r, on line r, and a counterpart reset signal, rn, on line rn. The reset signal, r, is asserted as a high level, and concurrently the counterpart signal, rn, is asserted as a low level. The circuit outputs a carry signal, c, on line c, and a complemented carry signal, cn, on line cn.

Input line s1 of circuit 300 is connected to the gate of an N type field effect transistor ("NFET") QF37. Input line s2 is connected to the gates of NFET's QF34 and QF35. Input line s3 is connected to the gates of NFET's QF32 and QF33.

Input line s1n is connected to the gate of NFET QF43. Input line s2n is connected to the gates of NFET's QF40 and QF41. Input line s3n is connected to the gates of NFET's QF38 and QF39.

Reset line, r, is connected to the gates of NFET's QR36 and QR42 (the "charge redistribution FET's") and NFET's QR44 and QR45 (the "reset discharge FET's"). The sources of the reset discharge FET's are grounded. The drains of QR44 and QR45 are connected to nodes CL1 and CL1c, respectively.

The reset counterpart line, rn, is connected to the gates of P type FET's ("PFET's") QR48 and QR51 (the "reset FET's"). All four of these FET's, with gates tied to lines r or rn, have their drains connected to a voltage supply, Vdd.

Carry line, c, is connected to the gate of PFET QS49 (a "holding current FET"), and the drains of NFET QF54 and PFET QF59. PFET's QS49 and QF59 have their sources tied to voltage supply Vdd. The source of QF54 is connected to ground. The carry complement line, cn, is connected to the gate of PFET QS50 (another "holding current FET"), and the drains of NFET QF57 and PFET QF60. PFET's QS50 and QF60 have their sources tied to voltage supply Vdd. The source of QF57 is connected to ground.

In general terms, the FET's of circuit 300 provide the following functions. NFET's QF32 through QF35 and QF37 (the "AND/OR gate FET's" or "evaluating FET's") evaluate for a certain boolean combination of input signals s1, s2 and s3. NFET's QF38 through QF41 and QF43 (the "complement AND/OR gate FET'S" or "complement evaluating FET's") evaluate for the same boolean combination of complementary input signals s1n, s2n, and s3n. Various other FET's in circuit 300 provide ancillary functions such as supplying charging current, reset and timing signals, and compensation for parasitic capacitances. These functions are described in further detail below.

Generally, node CL2 in circuit 300 is pulled down toward ground by a combination of signals s1, s2 and s3 satisfying the carry condition. Likewise, node CL2a in circuit 300 is generally pulled down toward ground by a combination of signals s1n, s2n and s3n satisfying the not carry condition. The s, sn, r, and rn signals are logically constrained such that the signals should not occur in a combination which pulls down nodes CL2 and CL2a together during the evaluation period.

Connected to CL2 are the drains of NFET's QF35 and QF37, and PFET's QR48 and QS49, and the gates of PFET QF59 and NFET QF54. The source of QF35 is connected to the drains of QF32 and QR44 at node CL1. The sources of QF32, QF33, QF34 and QR44 are connected to ground. The source of QF37 is connected to the drain of QF34 and the node is referred to as node CL1a. The drain of NFET QF33 and the source of NFET QR36 are also connected to node CL1a.

Connected to CL2a are the drains of NFET's QF41 and QF43, and PFET's QR51 and QS50, and the gates of PFET QF60 and NFET QF57. The source of QF41 is connected to the drain of QF38 and QR45 at node CL1c. The sources of QF38, QF39, QF40 and QR45 are connected to ground. The source of QF43 is connected to the drain of QF40 and the node is referred to as CL1d. The drain of NFET QF39 and the source of NFET QR42 are also connected to node CL1d.

Circuit 300 operates as described below. Generally, the following discussion will describe signals without reference to complements or counterparts of the signals, but it should be understood that the complements or counterparts exist and the circuit responds accordingly.

Figure 1:
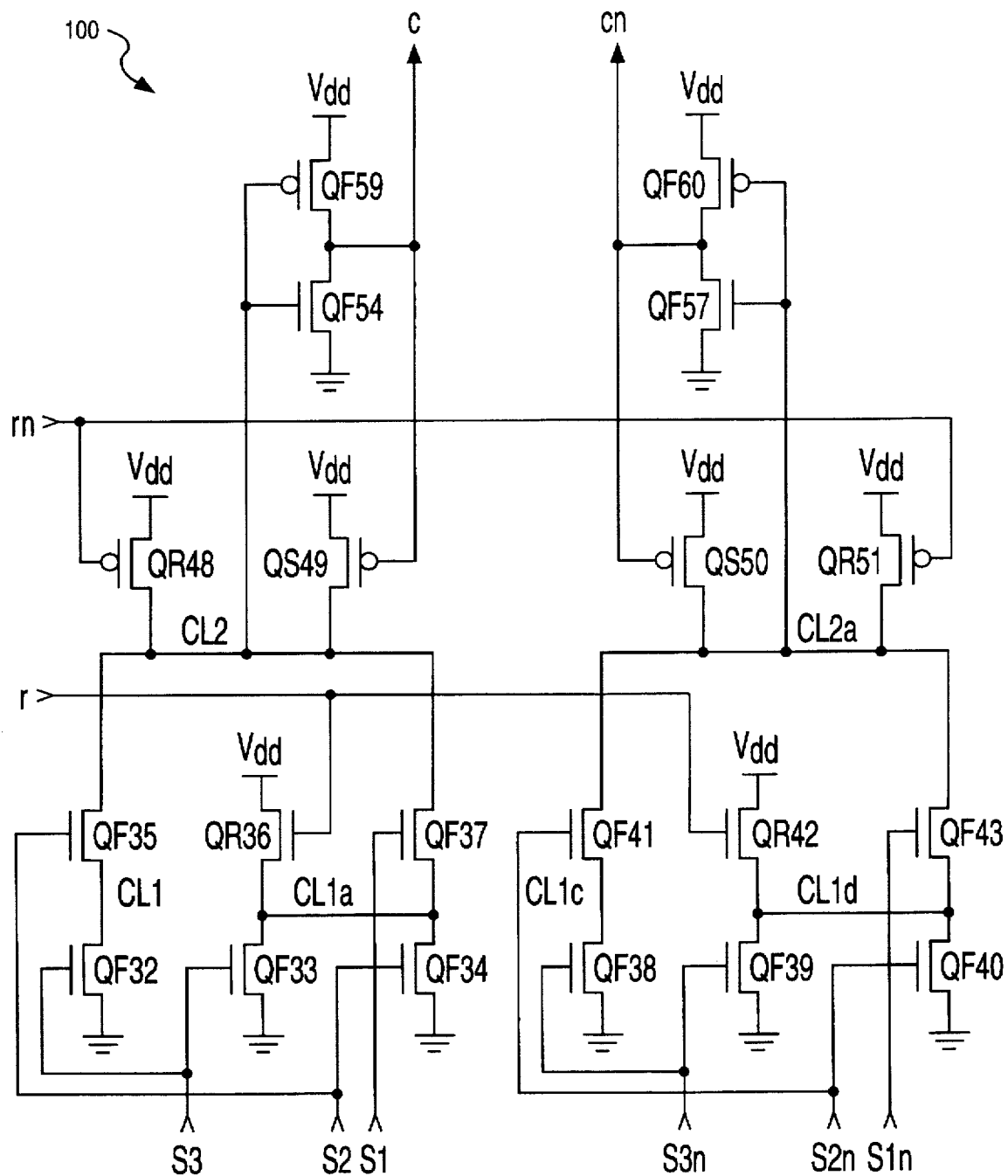
FIG. 1 is a circuit diagram for a prior art carry circuit.
Figure 2:
FIG. 2 is a timing diagram illustrating reset, standby, and evaluation periods for a carry circuit.

The input signals, s1, s2 and s3, and complementary input signals, s1n, s2n, and s3n are presented to the circuit 300 during an evaluation period according to a certain timing sequence established externally to the circuit 300. Aspects of this timing are illustrated in FIG. 2. According to this timing, a standby period begins when the reset signal, r, is deasserted. An evaluation period then begins when one or more of the input signals, s1, s2, and s3, are asserted. The evaluation period ends when the input signals are deasserted. A reset period then begins when r is asserted. During the evaluation period, the data signals s1, s2 and s3 are valid and one or more of them may be asserted for evaluation by the carry circuit 300. In a further aspect, not shown in FIG. 2, the data signals arrive at circuit 300 in a certain sequence in time.

During the evaluation period the circuit evaluates the inputs, performing a combination of logical "AND/OR" functions such that, for example, the circuit 300 asserts the carry signal, c, if any two of the inputs, s1, s2, and s3, are asserted. That is, in boolean terms, the carry condition is satisfied and the carry signal, c, is asserted if (s1*s2)+(s1*s3)+(s2*s3).

In an initial condition prior to evaluation, the data inputs, including both the s1, s2 and s3 signals and the s1n, s2n and s3n signals, are low, tending to turn off the AND/OR gate FET's and the complement AND/OR gate FET's. With the reset counterpart signal, rn, low, this tends to turn on the reset FET's, charging up node CL2 and CL2a.

With node CL2 charged up this tends to turn on QF54 and turn off QF59, which tends to pull down the carry line, c, connected to the drains of these FET's. With the carry signal, c, on carry line, c, tending to be low this tends to turn on holding current FET QS49.

At the beginning of the standby period the reset signal goes low tending to turn off the charge redistribution FET's. At the same time reset counterpart signal, rn, goes high, tending to turn off the reset FET's. Nevertheless, node CL2 tends to remain isolated since all the FET's connected to CL2 by their drains tend to be off, so that CL2 tends to hold its charge. However, leakage currents through the AND/OR gate FET's and FET QR36 tend to slowly counter the tendency of CL2 to hold its charge, so that the charge on CL2 would leak off to some extent if there were no holding current supply. QS49 supplies this holding current though so that CL2 remains charged in this state.

If, during the evaluation period, at least two data signals are asserted, among data signals, s1, s2 and s3, this tends to pull down node CL2, turn off QF54 and turn on QF59, which tends to pull up the carry signal and turn off the holding FET QS49. If, during the evaluation period, there are not at least two data signals asserted, then node CL2 tends to remain high, tending to keep QF54 and QS49 on, and QF59 off. At the end of the evaluation period, the data signals becoming inactive tends to turn off the AND/OR gate FET's. If node CL2 has been pulled low, it tends to remain low, however, as long as the reset counterpart signal, rn, remains high, tending to keep the reset FET's turned off. If node CL2 has not been pulled low, it tends to remain high, pulled up through holding current FET QS49.

During the reset period, the reset signal, r, tending to be high tends to turn on the charge redistribution FET's and precharge node CL1a—i.e., the capacitance associated with the drains of QF33 and QF34. This tends to reduce noise in circuit 300 during switching that may occur during evaluation.

This precharging of node CL1a also tends to prevent a possible erroneous operation of circuit 300 which may occur in a particular circumstance. That is, if during evaluation QF37 tends to be on and the input signals are such that QF33 and QF34 tend to be off, then the charge on CL2 could tend to leak off to CL1a, depending on the charge on CL1a. If this leaking caused the voltage on node CL2 to fall below a trip point of the QF59/QF54 inverter, the output c would go erroneously go high. However, with CL1a precharged this leaking off of charge on CL2 does not tend to occur and the erroneous output therefore does not tend to occur.

A feature of circuit 300 which tends to speed up evaluation concerns configuring the AND/OR gate FET's and the complement AND/OR gate FET's so the first to arrive data signal is evaluated at the AND/OR gate FET which is lowest among the AND/OR gate FET's relative to the connection of these FET's from ground to their common node. That is, for example, FET QF32, is lower than FET QF35 with respect to the connection of their source and drain electrodes between ground and common node CL2. This configuration will tend to speed up evaluation time if data signal s3 arrives before data signal s2, since the gate of QF32 receives data signal s3 and the gate of QF35 receives data signal s2.

Another feature of circuit 300 which tends to speed up evaluation in certain cases concerns the reset discharge FET's. For example, FET QR44 speeds up evaluation by circuit 300 in the case where, during a first evaluation, s2 is asserted on the signal side of circuit 300. Since prior to this first evaluation QR48 tended to be on, because rn was asserted as a low level during the reset period, CL2 tended to be charged to Vdd through PFET QR48. Then, during this first evaluation, with s2 asserted, QF35 tends to turn on, so that node CL1 tends to charge up to the Vdd level of CL2 minus the voltage threshold level of QF35. Next, at the end of the first evaluation period the input signals are not asserted. During the subsequent reset period, CL2 again is charged through QR48 tending to be on due to signal rn being asserted as a low level. Also, signal r asserted as a high level during reset tends to turn on QR36 so that CL1a charges to Vdd less the threshold voltage of NFET QR36.

If circuit 300 did not include the reset discharge FET QR44, then, during a second evaluation period, if s1 and s2 are asserted, QF34 must discharge the charge on node CL1a, which is tied directly to QF34 drain, and it must discharge CL2 through QF37. Also, it must discharge CL1 through QF37 and QF35. This particular case of discharging of nodes through QF34 during the second evaluation as just described, where the nodes have been charged up as described above during the first evaluation, slows down the second evaluation significantly. By the addition of reset discharge FET QR44, the CL1 node will tend to be discharged through QR44 during the reset period, following the above described first evaluation, by the signal r being asserted during reset tending to turn on QR44. Consequently, CL1 will tend to discharge less through QF34, QF35 and QF37 during the second evaluation, and the speed of the second evaluation will be increased accordingly. Also, because the discharge current through QF34, QF35 and QF37 is thus reduced, one or more of these FET's may be reduced in size, tending to obtain essentially the same switching speed in response to the input signals while reducing the device size and consuming less power.

The operation of circuit 100 and circuit 300 has been simulated to determine the improvement in speed offered by circuit 300. In the simulation the inputs were switched as follows (omitting reference to the input complement signals). First, s2 was asserted during a first evaluation period. Then, during a second evaluation period, s1 and s2 were asserted, so that the second evaluation triggered an output carry signal, c. In a first simulation case, during the second evaluation cycle s1 and s2 were asserted simultaneously. In a second case, s2 was asserted 6 picoseconds prior to s1 during the second evaluation cycle. In a third case, s2 was asserted 100 picoseconds prior to s1 during the second evaluation cycle. According to these simulations, for the first and second case, circuit 300 evaluated 10 picoseconds faster than circuit 100 during the second evaluation. For the third case circuit 300 evaluated 7 picoseconds faster. Since there are numerous serial carry stages in a CSA, this 7 to 10 picosecond improvement provided by circuit 300 may apply several times over, for a much greater aggregate speed improvement.

Although the present invention and its advantages have been described in detail, it should be understood that various changes, substitutions and alterations can be made without departing from the spirit and scope of the invention as defined by the following claims.

What is claimed is:

1. A dynamic logic circuit for precharging a first node during precharge intervals and evaluating input signals during evaluation intervals, wherein the first node discharges during such evaluation intervals in response to triggering combinations of the input signals, the dynamic logic circuit comprising:

precharge circuitry, coupled to the first node, for precharging the node;

first logic circuitry, coupled to the first node, for receiving a first one of the input signals;

second logic circuitry for receiving a second one of the input signals, wherein the second logic circuitry is coupled at a second node to the first logic circuitry, and thereby coupled to the first node through the first logic circuitry, and wherein the second node charges up in response to a certain non-triggering combination of the input signals; and discharge circuitry, coupled to the second node, for discharging the second node between the evaluation intervals, wherein in response to a certain one of the triggering combinations of the input signals the second node tends to discharge through the first logic circuitry and the first node, so that discharging the second node between the evaluation intervals speeds discharging of the first node.

2. A method in a dynamic logic circuit, comprising the steps of a) precharging a first node during precharge intervals;

b) evaluating a first combination of input signals during a first evaluation interval, wherein a charge accumlates on a second node in response to the first combination of input signals;

c) discharging the second node before a second evaluation interval; and d) evaluating a second combination of the input signals during the second evaluation interval, wherein for the second combination of the input signals the first node will discharge, and, if charged up, the second node would discharge through the first node, so that the first node's discharging is speeded up by the second node having been already discharged in step c).

* * * * *